United States Patent
Kim

(10) Patent No.: US 7,982,813 B2
(45) Date of Patent: Jul. 19, 2011

(54) LIQUID CRYSTAL DISPLAY

(75) Inventor: Duk-Sung Kim, Yeosu-si (KR)

(73) Assignee: Samsung Electronics, Co., Ltd., Suwon-Si (KR)

( * ) Notice: Subject to any disclaimer, the term of this patent is extended or adjusted under 35 U.S.C. 154(b) by 236 days.

(21) Appl. No.: 11/750,701

(22) Filed: May 18, 2007

(65) Prior Publication Data

US 2008/0067511 A1    Mar. 20, 2008

(30) Foreign Application Priority Data

May 25, 2006  (KR) ........................ 10-2006-0047074

(51) Int. Cl.
*G02F 1/136* (2006.01)
*H01L 29/04* (2006.01)

(52) U.S. Cl. ................. 349/43; 349/42; 349/46; 257/59

(58) Field of Classification Search ........................ None
See application file for complete search history.

(56) References Cited

U.S. PATENT DOCUMENTS

| 5,949,502 | A | 9/1999 | Matsunaga et al. | |
|---|---|---|---|---|
| 6,466,281 | B1 * | 10/2002 | Huang et al. | ........... 349/44 |
| 6,924,853 | B2 | 8/2005 | Park et al. | |
| 2002/0075421 | A1 * | 6/2002 | Wu | ................................ 349/43 |
| 2005/0083292 | A1 * | 4/2005 | Moon et al. | ................... 345/100 |
| 2007/0002195 | A1 * | 1/2007 | Cho | ................................ 349/43 |
| 2007/0171348 | A1 * | 7/2007 | Moon | ........................... 349/151 |

FOREIGN PATENT DOCUMENTS

| JP | 08-114815 | 5/1996 |
|---|---|---|
| JP | 2003-195338 | 7/2003 |
| JP | 2006-018165 | 1/2006 |
| KR | 1020010095893 A | 11/2001 |
| KR | 1020030095904 A | 12/2003 |
| KR | 1020030095905 A | 12/2003 |
| KR | 1020050067940 A | 7/2005 |
| KR | 1020050096564 A | 10/2005 |
| KR | 1020050097033 A | 10/2005 |
| KR | 1020050122606 A | 12/2005 |

* cited by examiner

*Primary Examiner* — Michelle R Connelly Cushwa
(74) *Attorney, Agent, or Firm* — F. Chau & Associates, LLC

(57) ABSTRACT

A liquid crystal display includes a substrate, a plurality of pixels including a plurality of switching elements, a plurality of gate lines connected to the switching elements and extending in a row direction, and a gate driver including a circuit portion connected to the gate lines and a wiring portion connected to the circuit portion. The circuit portion includes a transistor and the wiring portion includes a signal line, and the transistor and the signal line are connected via a connecting member, whereby electrostatic electricity is prevented from being introduced in the gate driver of the display during a manufacturing process.

12 Claims, 10 Drawing Sheets

LIQUID CRYSTAL DISPLAY

CROSS-REFERENCE TO RELATED APPLICATION

This application claims priority to and the benefit of Korean Patent Application No. 10-2006-0047074 filed in the Korean Intellectual Property Office on May 25, 2006, the entire contents of which are incorporated herein by reference.

BACKGROUND OF THE INVENTION (a) Technical Field

The present disclosure relates to a liquid crystal display.

(b) Discussion of Related Art

A liquid crystal display (LCD) is one of the most widely used flat panel displays. An LCD includes two panels provided with field-generating electrodes, such as pixel electrodes and a common electrode, and a liquid crystal (LC) layer interposed therebetween. The LCD displays images by applying voltages to the field-generating electrodes to generate an electric field across the LC layer, which determines orientations of LC molecules in the LC layer to adjust the polarization of incident light.

The LCD further includes a plurality of switching elements connected to the pixel electrodes and a plurality of signal lines such as gate lines and data lines for controlling the switching elements to apply voltages to the pixel, electrodes. The gate lines transmit, gate signals generated by a gate driving circuit, the data lines transmit data voltages generated by a data driving circuit, and the switching elements transmit data voltages to the pixel electrodes according to the gate signals.

The gate driver and the data driver may be implemented on a chip that is mounted on the display panel. A structure of integrating the gate driver in the display panels, however, has been recently developed in an effort to reduce the overall size of display devices and increase productivity.

Exemplary embodiments of the present invention have been made in art effort to provide a liquid crystal display that prevents electrostatic electricity from being introduced into a gate driver integrated in a display panel in a manufacturing process of a liquid crystal display.

SUMMARY OF THE INVENTION

A liquid crystal display according to an exemplary embodiment of the present invention includes: a substrate; a plurality of pixels including a plurality of switching elements; a plurality of gate lines connected to the switching elements and extending in a row direction; and a gate driver including a circuit portion connected to the gate lines and a wiring portion connected to the circuit portion. The circuit portion includes a transistor and the wiring portion includes a first signal line that receives an external signal and transmits the signal to the transistor, and the transistor and the signal line are connected via a connecting member. The connecting member is formed on a different layer from the transistor and the first signal line.

The signal line may transmit a scanning start signal to the transistor.

The transistor may comprise a control terminal and the control terminal and the first signal line are made of the same material as the gate lines.

The connecting member may include ITO (indium tin oxide) or IZO (indium zinc oxide).

The liquid crystal display may further include a passivation layer formed between the connecting member, the first signal line, and the transistor.

The passivation layer may have a first contact hole for connecting the first signal line and the connecting member, and a second contact hole for connecting the transistor and the connecting member.

The liquid crystal display may include at least one lead line connected to the control terminal and connected to the first signal line via the connecting member.

The circuit portion and the wiring portion may be integrated on the substrate, respectively.

The wiring portion may further comprises a second signal line that transmits control signals to the circuit portion.

A liquid crystal display according to an exemplary embodiment of the present invention includes: a substrate; a plurality of pixels including a plurality of switching elements; a plurality of gate lines connected to the switching elements and extending in a row direction; and a gate driver including a plurality of circuit portions connected to the gate lines and a wiring portion connected to the circuit portions. The wiring portion includes a signal line, each of the circuit portions includes a transistor connected to the signal line, and the transistor includes at least two lead lines directly connected to the signal line.

The signal line can transmit a scanning start signal to the transistor.

The lead line and the signal line may be made of the same material.

BRIEF DESCRIPTION OF THE DRAWINGS

Exemplary embodiments of the present invention will be understood in more detail from the following descriptions taken in conjunction with the accompanying drawings.

DETAILED DESCRIPTION OF EXEMPLARY EMBODIMENTS

The present invention will now be described more fully hereinafter with reference to the accompanying drawings, in which exemplary embodiments of the present invention are shown. As those skilled in the art would realize, the described exemplary embodiments may be modified in various different ways, all without departing from the spirit or scope of the present invention.

First, a liquid crystal display according to an exemplary embodiment of the present invention will be described with reference to FIG. 1 and FIG. 2.

Figure 1:
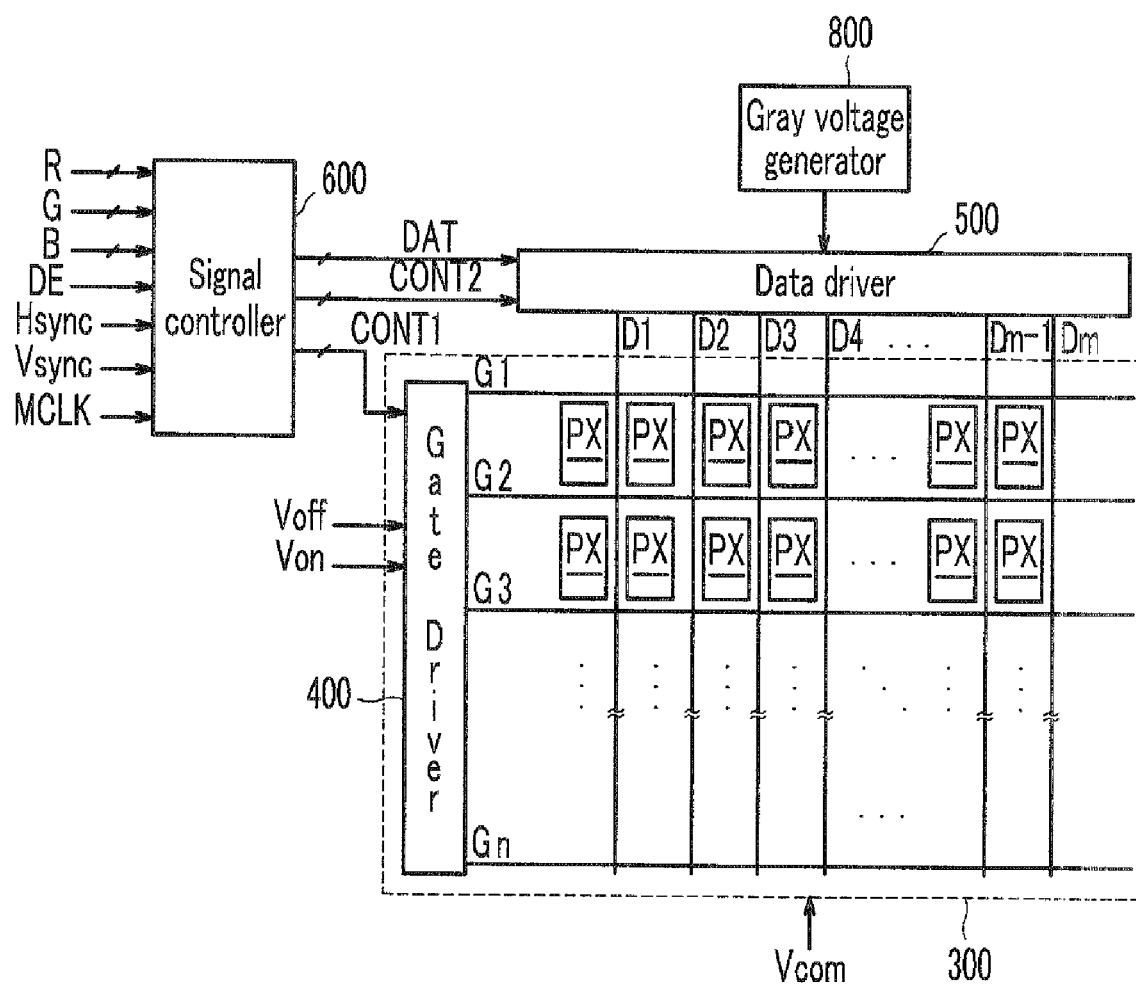
FIG. 1 is a block diagram of an LCD according to an exemplary embodiment of the present invention.
Figure 2:
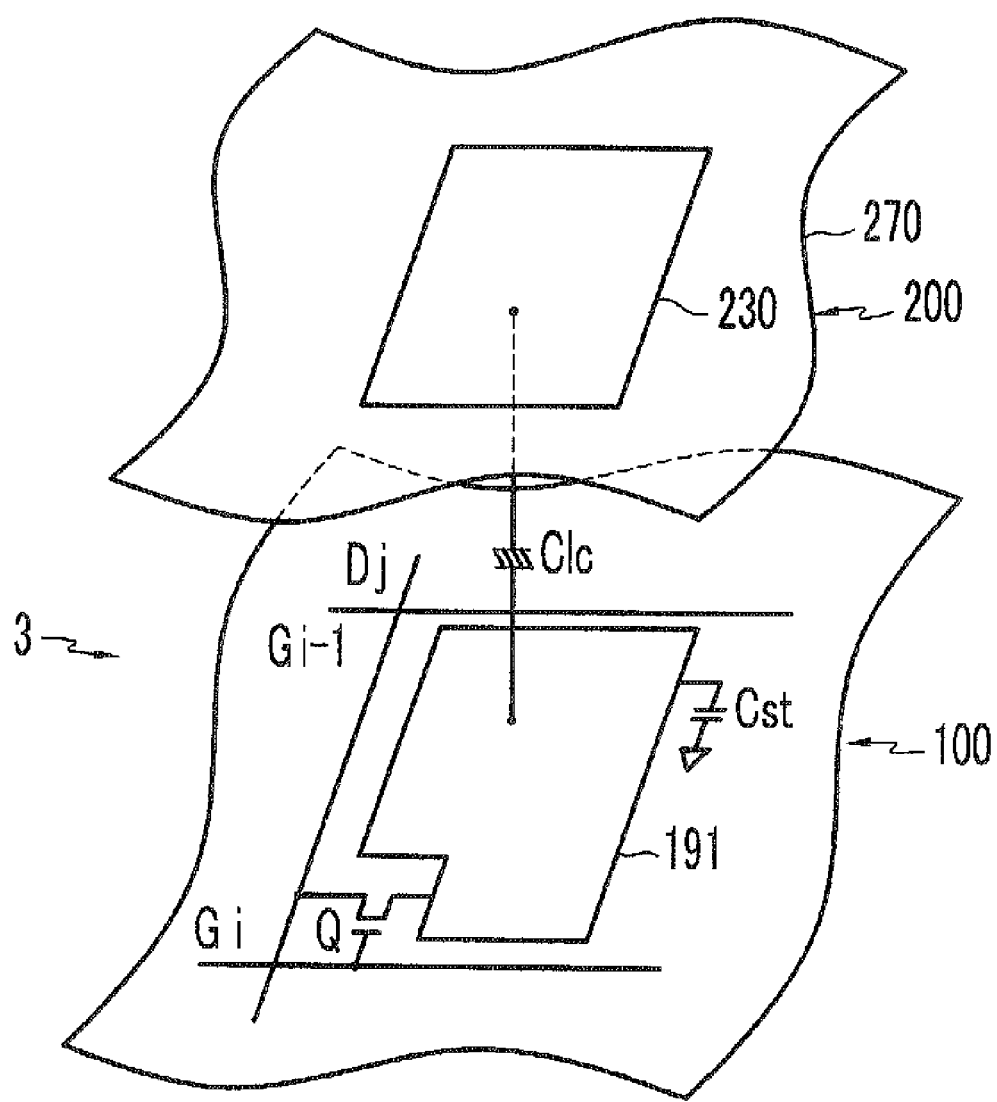
FIG. 2 is an equivalent circuit diagram of a pixel of an LCD according to an exemplary embodiment of the present invention.

FIG. 1 is a block diagram of an LCD according to an exemplary embodiment of the present invention, and FIG. 2 is an equivalent circuit diagram of a pixel of an LCD according to an exemplary embodiment of the present invention.

Referring to FIGS. 1 and 2, an LCD according to an exemplary embodiment of the present invention includes a liquid crystal panel assembly 300, a gate driver 400 and a data driver 500 connected to the liquid crystal panel assembly 300, a gray voltage generator 800 connected to the data driver 500, and a signal controller 600 controlling the above-described elements.

In an equivalent circuit view, the liquid crystal panel assembly 300 includes a plurality of signal lines $G_1$-$G_n$ and $D_1$-$D_m$, and a plurality of pixels PX connected thereto and arranged substantially in a matrix. In a structural view as shown in FIG. 2, the liquid crystal panel assembly 300 includes lower and upper panels 100 and 200 facing each other, and a liquid crystal layer 3 interposed therebetween.

The signal lines include a plurality of gate lines $G_1$-$G_n$ for transmitting gate signals, also referred to as "scanning signals", and a plurality of data lines $D_1$-$D_m$ for transmitting data signals. The gate lines $G_1$-$G_n$ extend substantially in a row direction and are substantially parallel to each other, while the data lines $D_1$-$D_m$ extend substantially in a column direction and are also substantially parallel to each other.

Each pixel includes a switching element Q connected to the signal lines and a liquid crystal (LC) capacitor Clc and a storage capacitor Cst that are connected to the switching element Q. The storage capacitor Cst may be omitted as desired.

The switching element Q is provided on the lower panel 100 and has three terminals: a control terminal connected to the gate line $G_i$; an input terminal connected to the data line $D_j$; and an output terminal connected to both the LC capacitor ClC and the storage capacitor Cst.

The LC capacitor Clc includes a pixel electrode 191 provided on the lower panel 100 and a common electrode 270 provided on the upper panel 200 as its two terminals. The LC layer 3 disposed between the two electrodes 191 and 270 functions as a dielectric of the LC capacitor Clc. The pixel electrode 191 is connected to the switching element Q. The common electrode 270 is supplied with a common voltage Vcom and covers the entire surface of the upper panel 200. Unlike what is shown in FIG. 2, the common electrode 270 may be provided on the lower panel 100, and at least one of the electrodes 191 and 270 may have a shape of a bar or a stripe.

The storage capacitor Cst is an auxiliary capacitor for the LC capacitor Clc. When the pixel electrode 191 and a separate signal line (not shown) that is provided on the lower panel 100 are overlapped with each other with an insulator interposed therebetween, the overlap portion becomes the storage capacitor Cst. The separate signal line is supplied with a predetermined voltage such as the common voltage Vcom. Alternatively, the storage capacitor Cst may be formed by the overlapping of the pixel electrode 191 and a previous gate line, which is placed directly before the pixel electrode 191, and interposing an insulator therebetween.

For a color display, each pixel uniquely exhibits one of three primary colors, that is spatial division, or sequentially exhibits three primary colors in turn depending on time, that is temporal division, so that a spatial or temporal sum of the primary colors is recognized as a desired color. An example of a set of the primary colors includes red, green, and blue. FIG. 2 shows an example of the spatial division in which each pixel includes a color filter 230 for exhibiting one of the primary colors in an area of the upper panel 200 corresponding to the pixel electrode 191. Unlike what is shown in FIG. 2, the color filter 230 may be provided on or under the pixel electrode 191 of the lower panel 100.

Polarizers (not shown) are provided on outer surfaces of the liquid crystal panel assembly 300 for polarizing the light.

Referring to FIG. 1 again, the gray voltage generator 800 generates two sets of gray voltages related to light transmittance of the pixels. The gray voltages in a first set have a positive polarity with respect to the common voltage Vcom, while the gray voltages in a second set have a negative polarity with respect to the common voltage Vcom.

The gate driver 400 is connected to the gate lines $G_1$-$G_n$ of the LC panel assembly 300 for applying the gate signals consisting of combinations of gate-on voltages Von and gate-off voltages Voff to the gate lines $G_1$-$G_n$. The gate driver 400 is substantially a shift register including a plurality of stages arranged in a line, and is formed and integrated on the LC panel assembly 300 in the same process that the signal lines $G_1$-$G_n$ and $D_1$-$D_m$, the thin film transistor switching element Q, and the like, are formed.

The data driver 500 is connected to the data lines $D_1$-$D_m$ of the LC panel assembly 300, and selects as data signals gray voltages from the gray voltage generator 800 and applies them to the data lines $D_1$-$D_m$. In a case where the gray voltage generator 800 does not provide all voltages for all gray values but only provides a predetermined number of reference gray voltages, however, the data driver 500 divides the reference gray voltages to generate gray voltages for all gray values and selects data signals from among them.

The signal controller 600 controls the gate driver 400 and the data driver 500.

Each of the units 500, 600, and 800 may be directly mounted as at least one integrated circuit (IC) chip mounted on the LC panel assembly 300, or on a flexible printed circuit film (not shown) in a tape carrier package (TCP) type, which are attached to the LC panel assembly 300, or they may be mounted on a separate printed circuit board (not shown). Alternatively, the units 500, 600, and 800 may be directly integrated into the LC panel assembly 300 along with the signal lines $G_1$-$G_n$ and $D_1$-$D_m$, the thin film, transistor switching element Q, and the like. Further, the units 500, 600, and 800 may be integrated as a single chip. In that case, at least one of the units or at least one circuit device constituting them may be located outside of the single chip.

Hereinafter, operation of the LCD will be described in detail.

The signal controller 600 receives input image signals R, G, and B from an external graphics controller (not shown) and receives input control signals for controlling a display thereof. Examples of the input control signals include a vertical synchronization signal Vsync, a horizontal synchronizing signal Hsync, a main clock signal MCLK, and a data enable signal DE.

In response to the input image signals R, G, and B and the input control signals, the signal controller 600 processes the input image signals R, G, and B suitably for operation of the LC panel assembly 300 and generates gate control signals CONT1 and data control signals CONT2, and then outputs the gate control signals CONT1 to the gate driver 400 and the data control signals CONT2 and processed image signals DAT to the data driver 500.

The gate control signals CONT1 include a scanning start signal for instructing the start of scanning, and at least one clock signal for controlling an output time of the gate-on voltage Von. The gate control signals CONT1 may further include an output enable signal for defining a duration of the gate-on voltage Von.

The data control signals CONT2 include a horizontal synchronizing start signal for informing of a beginning of a data transmission of image data for a row of pixels PX, a load signal for instructing to apply the data signals to the data lines $D_1$-$D_m$, and a data clock signal. The data control signals CONT2 may further include a reverse signal for reversing a polarity of the voltage of the data signals with respect to the common voltage Vcom, hereinafter, the polarity of the voltage of the data signals will be shortened to "polarity of the data signals".

In response to the data control signals CONT2 from the signal controller 600, the data driver 500 receives digital image signals DAT for a row of pixels PX from the signal controller 600, converts the digital image signals DAT into analog data signals by selecting gray voltages corresponding to the digital image signals DAT, and then applies the analog data signals to corresponding data lines $D_1$-$D_m$.

The gate driver 400 applies the gate-on voltage Von to the gate lines $G_1$-$G_n$ in response to the gate control signals CONT1 from the signal controller 600, thereby turning on switching elements Q connected to the gate lines $G_1$-$G_n$. The data voltages applied to the data lines $D_1$-$D_m$ are applied to corresponding pixels PX through turned-on switching elements Q.

A difference between the voltages of the data signals applied to the pixel and the common voltage Vcom is represented as a voltage across the LC capacitor Clc, namely, a pixel voltage. The LC molecules in the LC capacitor Clc have orientations depending on a magnitude of the pixel voltage. Polarization of light passing through the LC layer 3 is varied according to orientations of the LC molecules. The polarizer attached to the LC panel assembly 300 converts a difference of light polarization into a difference of light transmittance.

By repeating the above-mentioned procedure each horizontal period, which is denoted by "1H" and is equal to one period of the horizontal synchronizing signal Hsync and the data enable signal DE, all gate lines $G_1$-$G_n$ are sequentially supplied with the gate-on voltage Von, thereby applying the data signals to all pixels to display images of one frame.

When the next frame starts after finishing one frame, the reverse signal applied to the data driver 500 as part of the control signal CONT2 is controlled such that the polarity of the data voltages is reversed with respect to that of a previous frame, which is referred to as "frame inversion". The reverse signal may be also controlled such that the polarity of the data signals flowing in a data line in one frame are reversed, for example, line inversion and dot inversion, or the polarity of the data voltages in one pixel row are reversed, for example, column inversion and dot inversion.

Hereinafter, the LC panel assembly and the gate driver formed on the LC panel assembly according to an exemplary embodiment of the present invention will be described in detail with reference to FIGS. 3 and 6.

Figure 3:
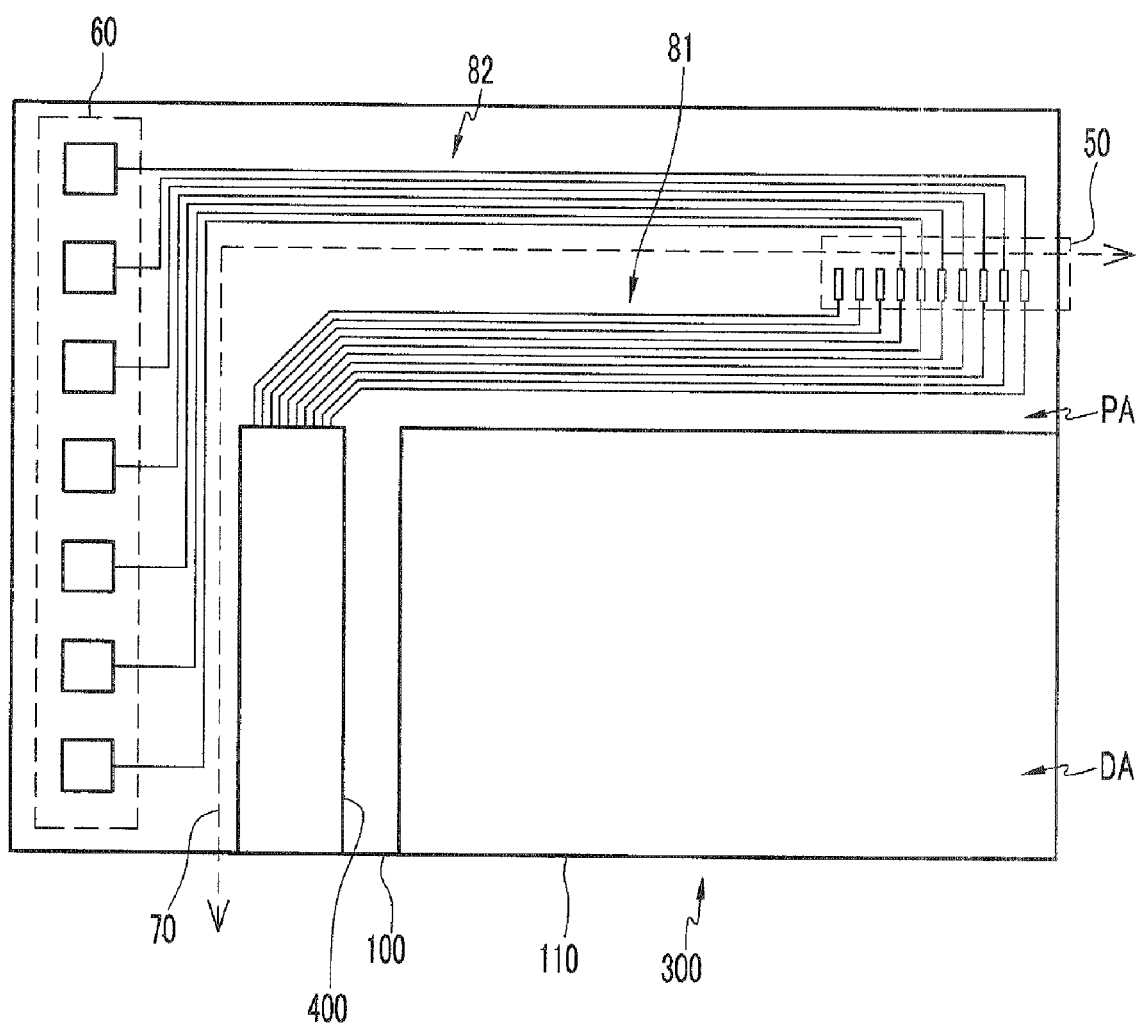
FIG. 3 is a top plan view of a liquid crystal panel assembly according to an exemplary embodiment of the present invention.

FIG. 3 is a top plan view of a liquid crystal panel assembly according to an exemplary embodiment of the present invention.

Referring to FIG. 3, a liquid crystal panel assembly 300 according to an exemplary embodiment of the present invention includes a TFT panel 100, a common electrode panel 200 (not shown), and an LC layer 3 (not shown) interposed between the two panels.

The liquid crystal panel assembly 300 is divided into a display area DA for displaying images and a peripheral area PA.

On the substrate 110 of the display area DA, gate lines $G_1$-$G_n$, data lines $D_1$-$D_m$ intersecting the gate lines $G_1$-$G_n$, thin film transistors (not shown) connected to the gate line $G_1$-$G_n$ and the data lines $D_1$-$D_m$, and pixel electrodes 191 connected to the thin film transistors and the like are formed.

A data driver (not shown) connected to the data lines $D_1$-$D_m$ is mounted on the upper peripheral area PA of the display area DA.

A gate driver 400 is integrated and formed on the lateral peripheral area PA of the display area DA.

An OLB (out lead bonding) pad 50 for inputting control signals from the signal controller 600 and the like into the gate driver 400 is formed on the upper peripheral area PA of the display area DA. The gate driver 400 and the OLB pad 50 are connected by a plurality of first connecting wires 81.

A test pad portion 60 neighboring the gate driver 400 is formed on the lateral peripheral area PA of the display area DA. The test pad portion 60 includes a plurality of pads, each pad receiving a clock signal CLK for testing the LC panel assembly, and the like, or a scanning start signal STV. The test pad portion 60 is connected to the OLB pad 50 via a plurality of second connecting wires 82, and test signals are input into the gate driver 400 through the OLB pad 50.

The substrate 110 is cut to divide it into two pieces according to a cut line 70

A gate driver of an LC panel assembly according to an exemplary embodiment of the present invention is described below with reference to FIGS. 4, 5, and 6.

Figure 4:
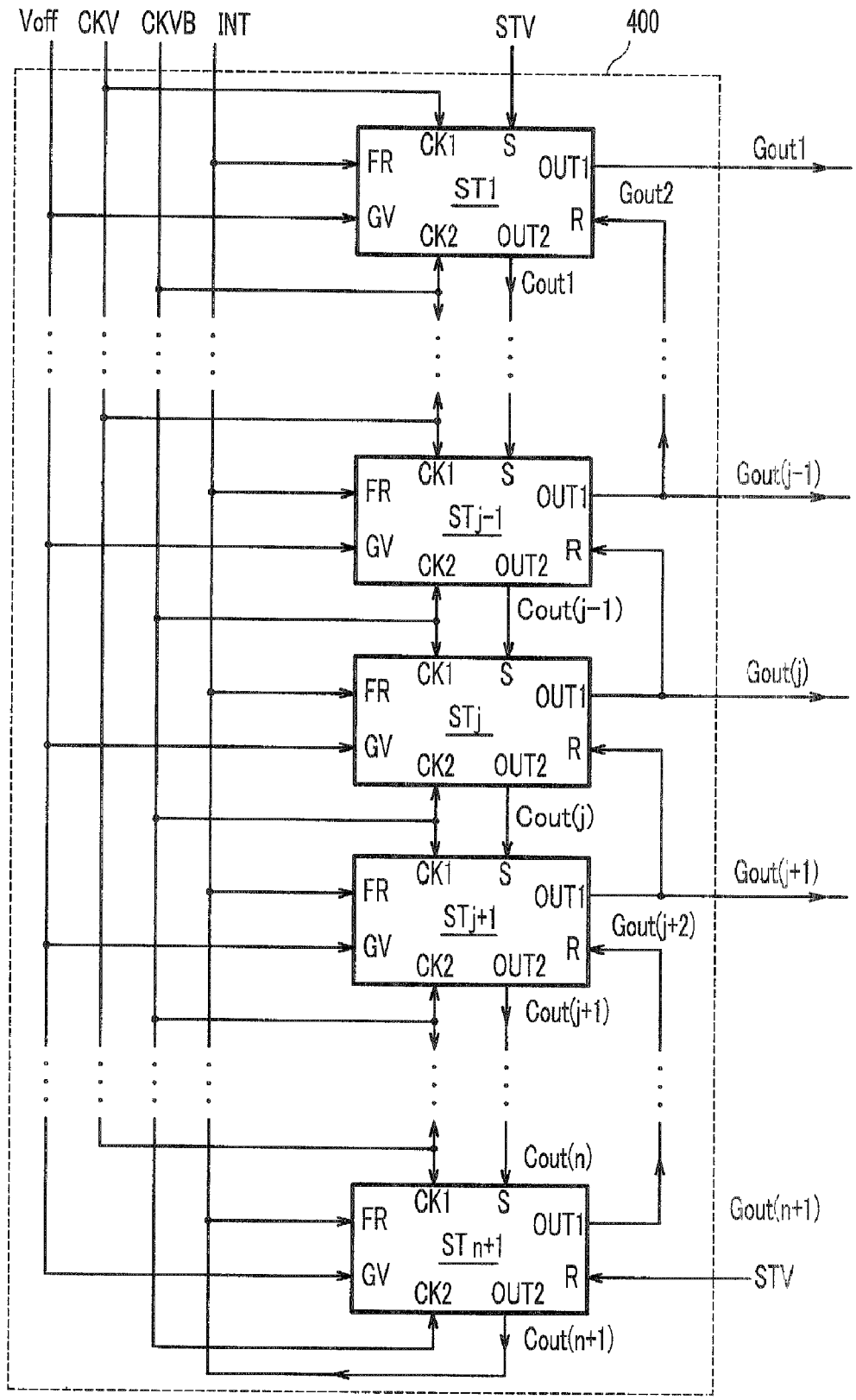
FIG. 4 is a block diagram of a gate driver according to an exemplary embodiment of the present invention.

FIG. 4 is a block diagram, of a gate driver according to an exemplary embodiment of the present invention. FIG. 5 is a circuit diagram of a j-th stage of a shift register used for a gate driver, and FIG. 6 is a schematic layout view of first and second stages of a gate driver according to an exemplary embodiment of the present invention.

Figure 5:
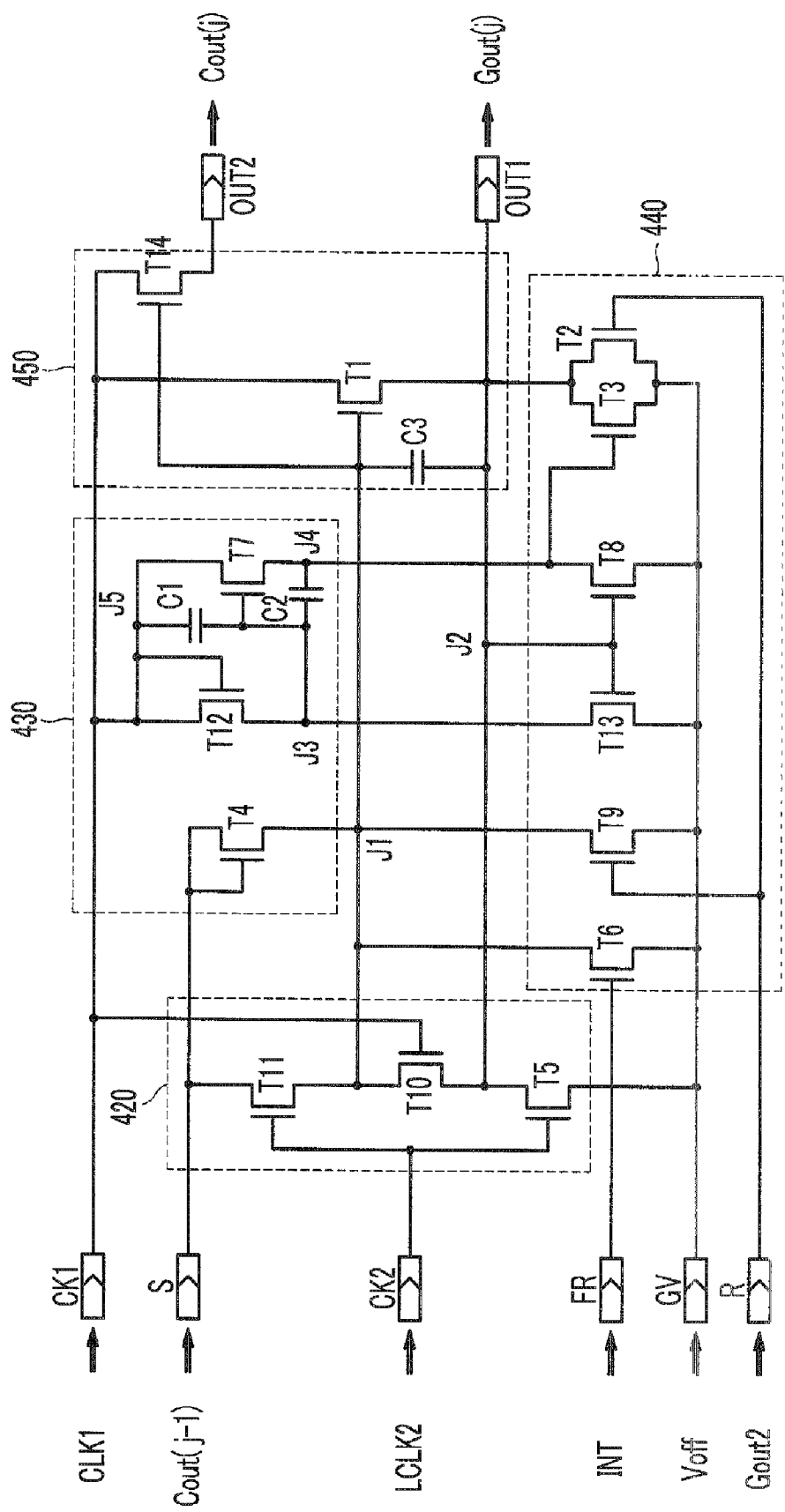
FIG. 5 is a circuit diagram of a j-th stage of a shift register for the gate driver shown in FIG. 4.
Figure 6:
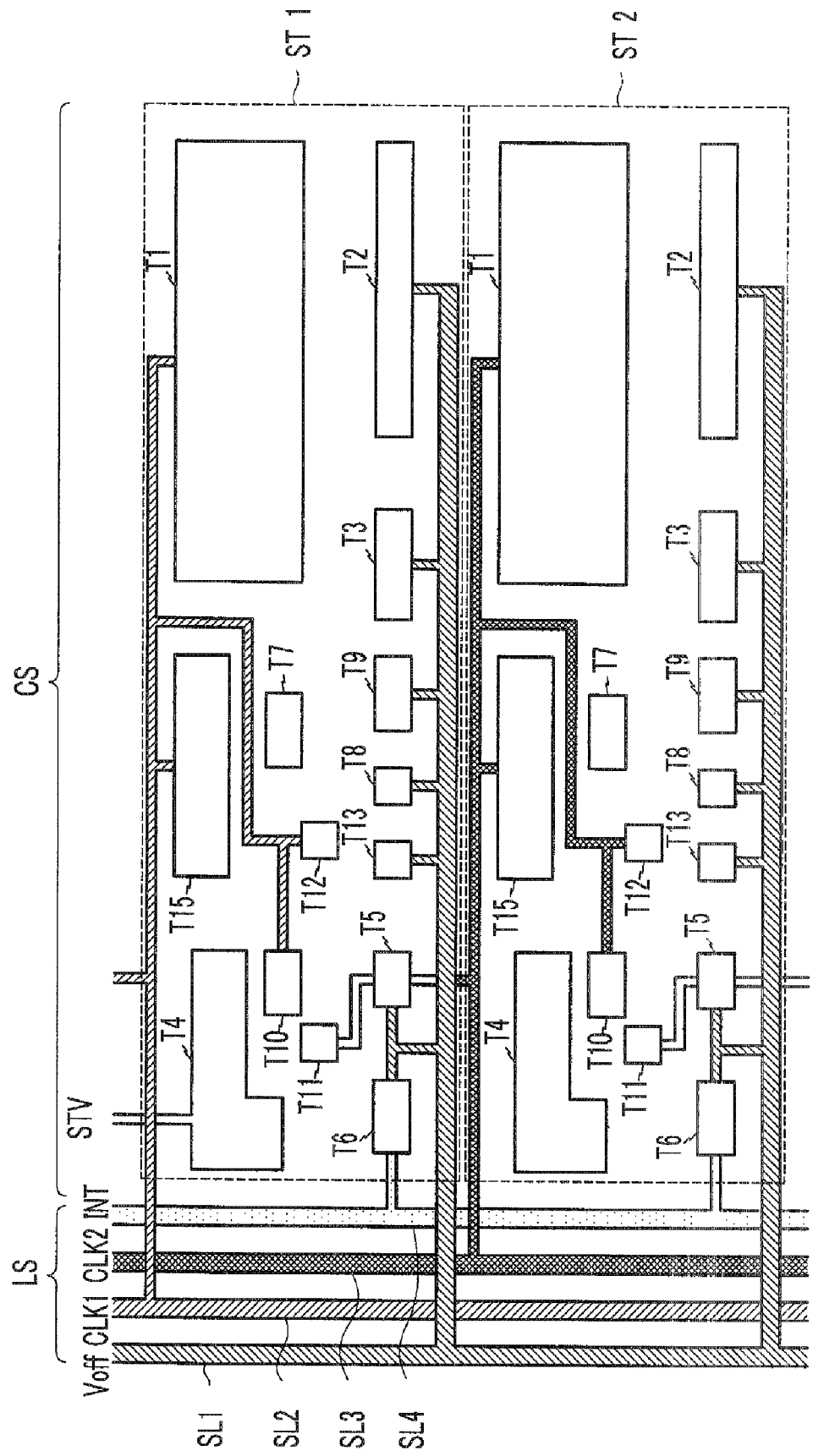
FIG. 6 is a schematic layout view of first and second stages of a gate driver according to an exemplary embodiment of the present invention.

Referring to FIGS. 4 to 6, a shift register 400 acting as the gate driver 400 shown in FIG. 1 receives a scanning start signal STV and first and second clock signals CLK1 and CLK2. The shift register 400 includes a plurality of stages (ST1, STj−1, STj, STj+1, and STn+1) connected to the gate lines, respectively. The plurality of stages ST1, STj−1, STj, STj+1, and STn+1 are subordinately connected to each other, and receive a scanning start signal STV and first and second clock signals ClK1 and CLK2.

If each of the clock signals CLK1 and CLK2 is high, the gate-on voltage Von is applied, and if each of the clock signals CLK1 and CLK2 is low, the gate-off voltage Voff is applied.

Each of the stages ST1, STj−1, STj, STj+1, and STn+1 includes a set terminal S, a gate-off voltage terminal GV, a pair of clock terminals CK1 and CK2, a reset terminal R, a gate output terminal OUT1 and a carry output terminal OUT2.

In each of the stages in this exemplary embodiment, the set terminal S of the j-th stage STj is supplied with a carry output of a previous stage ST(j−1), that is, a previous carry output Cout (j−1), and the reset terminal R thereof is supplied with a gate output of a next stage ST(j+2), i.e., a next gate output Gout(j+1). The clock terminals CK1 and CK2 thereof receive the clock signals CLK1 and CLK2, respectively, and the gate voltage terminal GV receives the gate-off voltage Voff. The gate output terminal OUT1 outputs a gate output Gout(j) and the carry output terminal OUT2 outputs a carry output Cout (j).

The first stage of each shift register 400 is supplied with the scanning start signal STV, however, instead of the previous carry output. When the first and second clock terminals CK1 and CK2 of the j-th stage receive the first and second clock signals CLK1 and CLK2, respectively, the first clock terminals CK1 of the (j−1)-th stage ST(j−1) and the (j+1)-th stage ST(j+1) receive the second clock signal CLK2 and the clock terminals CK2 thereof receive the first clock signal CLK1.

Referring to FIG. 5, each of the stages of the gate driver 400, for example the j-th stage, includes an input unit 420, a pull-up driving unit 430, a pull-down driving unit 440, and an output unit 450. Each of the above-described units 420, 430, 440, and 450 includes at least one NMOS transistor T1-T14, and the pull-up driving unit 430 and the output unit 450 further include capacitors C1-C3. It is understood that the NMOS transistors may be replaced by PMOS transistors. Further, the capacitors C1-C3 may have parasitic capacitances between a gate and either a drain or a source formed during a manufacturing process of the transistors.

The input unit 420 includes three transistors T11, T10, and T5 connected in series between the set terminal S and the gate voltage terminal GV. Gates of the transistors T11 and T10 are connected with the clock terminal CK2, and the gate of the transistor T10 is connected with the clock terminal CK1. A connection node between the transistor T11 and the transistor T10 is connected with a contact J1, and a connection node between the transistor T10 and the transistor T5 is connected with a contact J2.

The pull-up driving unit 430 includes a transistor T4 connected between the set terminal S and the contact J1, a transistor T12 connected between the clock terminal CK1 and a contact J3, and a transistor T7 connected between the clock terminal CK1 and a contact J4. The transistor T4 includes a gate and a drain commonly connected with the set terminal S and a source connected with the contact J1, and the transistor T12 includes a gate and a drain commonly connected with the clock terminal CK1 and a source connected with the contact J3. The transistor T7 has a gate connected with the contact J3 and, at the same time, with the clock terminal CK1 via the capacitor C1, a drain connected with the clock terminal CK1, and a source connected with the contact J4. The capacitor C2 is connected between the contact J3 and the contact J4.

The pull-down driving unit 440 includes transistors T6, T9, T13, T8, T3, and T2 applied with the gate-off voltage Voff via sources thereof for outputting to the contacts J1, J2, J3, and J4. A gate and a drain of the transistor T9 are connected with the reset terminal R and the contact J1, respectively. Gates of the transistors T13 and T8 are commonly connected with the contact J2, and drains thereof are connected with the contacts J3 and J4, respectively. A gate of the transistor T3 is connected with the contact J4, and a gate of the transistor T2 is connected with the reset terminal R. Drains of the transistors T3 and T2 are connected with the contact J2.

The output unit 450 includes a pair of transistors T1 and T14 and the capacitor C3. Drains and sources of the transistors T1 and T14 are connected with the clock terminal CK1 and the output terminals OUT1 and OUT2, and gates thereof are connected with the contact J1. The capacitor C3 is connected between the gate and the drain of the transistor T1, that is, between the contact J1 and the contact J2. The source of the transistor T1 is also connected with the contact J2.

The operation of such a shift-register stage is described below.

For purposes of convenience, a voltage corresponding with the high levels of the clock signals CLK1 and CLK2 is referred to as a high voltage, and a voltage corresponding with the low levels of the clock signals CLK1 and CLK2, which is the same as the magnitude of the gate-off voltage Voff, is referred to as a low voltage.

When the clock signal CLK2 and the previous gate output signal Gout(j−1) (or the scanning start signal STV) are high, the transistors T11, T5, and T4 turn on. Two transistors T11 and T4 transmit the high voltage to the contact J1 and the transistor T5 transmits the low voltage to the contact J2. Thus, the transistors T1 and T14 turn on and the clock signal CLK1 is transmitted to the output terminals OUT1 and OUT2. Since a voltage at the contact J2 and the clock signal CLK1 are low, the output voltages Gout(j) and Cout(j) are also low. Simultaneously, the capacitor C3 charges to a voltage of a magnitude corresponding to a difference between the high voltage and the low voltage.

Therefore, when the clock signal CLK1 and the next gate output Gout(j+1) are low and a voltage at the contact J2 is also low, the transistors T10, T9, T12, T13, T8, and T2, which have the gates connected thereto, are turned off.

Subsequently, when the clock signal CLK2 becomes low, the transistors T11 and T5 are turned off, and when the clock signal CLK1 becomes high, an output voltage of the transistor T1 and a voltage at the contact J2 become the high voltage. When the high voltage is applied to the gate of the transistor T10, the potential of the source connected with the contact J2 is also the high voltage, and therefore a potential difference between the gate and the source becomes 0 and the transistor T10 remains turned off. Accordingly, the contact J1 is in a floating state and a potential of the contact J1 increases proportionally with the high voltage by the capacitor C3.

Because the potentials of the clock signal CLK1 and the contact J2 are the high voltage, however, the transistors T12, T13, and T8 are turned off. The transistor T12 and the transistor T13 are connected in series between the high and the low voltages. Thus, a potential at the contact J3 becomes a voltage value divided by resistances in ohmic states at the turned-on time of the two transistors T12 and T13. When the resistance in the ohmic state at the turned-on time of the transistor T13 is set to be much larger, for example, 10,000 times that of the transistor T12, a voltage at the contact J3 is substantially identical to the high voltage. Accordingly, the transistor T7 is turned on to be connected in series with the transistor T8, and thereby a potential at the contact J4 becomes a voltage value divided by resistances in ohmic states at the turned-on time of the two transistors T7 and T8. When the resistances in the ohmic state at the turned-on time the of two transistors T7 and T8 are set to be substantially identical to each other, the potential at the contact J4 becomes a middle value of the high and the low voltages, and thus the transistor T3 is turned off. Since the next gate output Gout(j+1) remains low, the transistors T9 and T2 are also turned off. Accordingly, the output terminals OUT1 and OUT2 are only connected with the clock signal CLK1 and they are disconnected from the low voltage, thereby to output the high voltage.

Additionally, the capacitors C1 and C2 charge to voltages corresponding to potential differences developed at both terminals, respectively, and a voltage at the contact J3 is lower than a voltage at the contact J5.

Subsequently, when the next gate output Gout(j+1) and the clock signal CLK2 become high and the clock signal CLK1 becomes low, the transistors T9 and T2 are turned on to transmit the low voltage, to the contacts J1 and J2. At this time, a voltage at the contact J1 decreases to the low voltage while the capacitor C3 discharges, and a certain amount of time is needed until the voltage at the contact J1 completely becomes the low voltage. Accordingly, two transistors T1 and T14 are turned on for a while after the next gate output Gout(j+1) voltage becomes high, and thereby the output terminals OUT1 and OUT2 are connected with the clock signal CLK1 to output the low voltage. When the potential at the contact J1 reaches the low voltage due to complete discharge of the capacitor C3, the transistor T14 is turned off to disconnect the output terminal OUT2 from the clock signal CLK1, and the carry output Cout(j) is in a floating state and the voltage remains low. Because the output terminal OUT1 is connected with the low voltage via the transistor T2 irrespective of a turned-off state of the transistor T1, however, a low voltage is continuously output.

When the transistors T12 and T13 are turned off, the contact J3 is in a floating state. Additionally, since a voltage at the contact J5 is lower than a voltage at the contact J4, and since the voltage at the contact J3 remains lower than the voltage at the contact J5 because of the capacitor C1, the transistor T7 is turned off. Simultaneously, the transistor T8 is turned off and the voltage at the contact J4 decreases by the same amount, and thus the transistor T3 remains turned off. Additionally, the transistor T10 is connected with the low voltage of the gate clock signal CLK1 and the voltage at the contact J2 is low, and thus the transistor T3 remains turned off.

Since the transistors T12 and T7 are turned on due to the high voltage of the clock signal CLK1 and the increase of the voltage at the contact J4 turns on the transistor T3 so that the low voltage is transmitted to the contact J2, the output terminal OUT1 continuously outputs the low voltage. That is, even though the voltage of the next gate output Gout(j+1) is low, the voltage at the contact J2 is made to be the low voltage.

Additionally, the gate of the transistor T10 is connected with the high voltage of the clock signal CLK1 and the voltage at the contact J2 is the low voltage, and thus the transistor T10 is turned on to transmit the voltage at the contact J2 to the contact J1. On the other hand, the drains of two transistors T1 and T14 are connected with the clock terminal CK1 to be continuously applied with the clock signal CLK1. More specifically, the transistor T1 has a larger size than the remaining transistors, and thereby a parasitic capacitance between the gate and the drain thereof is sufficiently large such that voltage variation of the drain may affect a gate voltage. Accordingly, an increase of the gate voltage due to the parasitic capacitance between the gate and the drain of the transistor T1 on the high voltage of the clock signal CLK1 turns on the transistor T1. In this case, such voltage prevents the transistor T1 from turning on such that the gate voltage of the transistor T1 maintains the low voltage by transmitting the low voltage at the contact J2 to the contact J1.

The voltage at the contact J1 is maintained at the low voltage until the voltage of the previous carry output Cout(j−1) becomes high. The voltage at the contact J2 is the low voltage via the transistor T3 when the clock signal CLK1 is high and the clock signal CLK2 is low. The voltage at the contact J2 is the low voltage via the transistor T5 when the clock signal CLK1 is low and the clock signal CLK2 is high.

In addition, the transistor T6 is supplied with, the initializing signal INT output from the last dummy stage (not shown) to transmit the gate-off voltage Voff to the contact J1, thereby setting the voltage at the contact J1 to be the low voltage again.

Each stage ST1, STj−1, STj, STj+1, and STn+1 generates the carry signal Cout(j) and the gate output Gout(j) synchronized with the clock signals CLK1 and CLK2 according to the previous carry signal Cout(j−1) and the subsequent gate output Gout(j+1).

Now, the connection between a gate driver and a scanning start signal line according to an exemplary embodiment of the present invention, will be described in detail with reference to FIGS. 7 and 8 in conjunction, with the above-explained FIG. 6.

Figure 7:
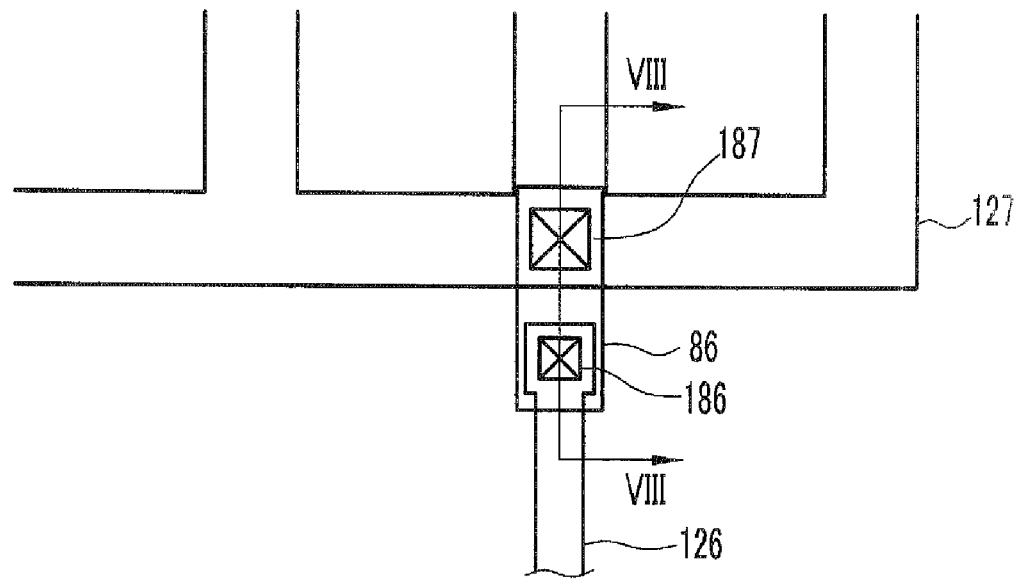
FIG. 7 is an enlarged layout view showing a part of the gate driver as shown in FIG. 6.
Figure 8:
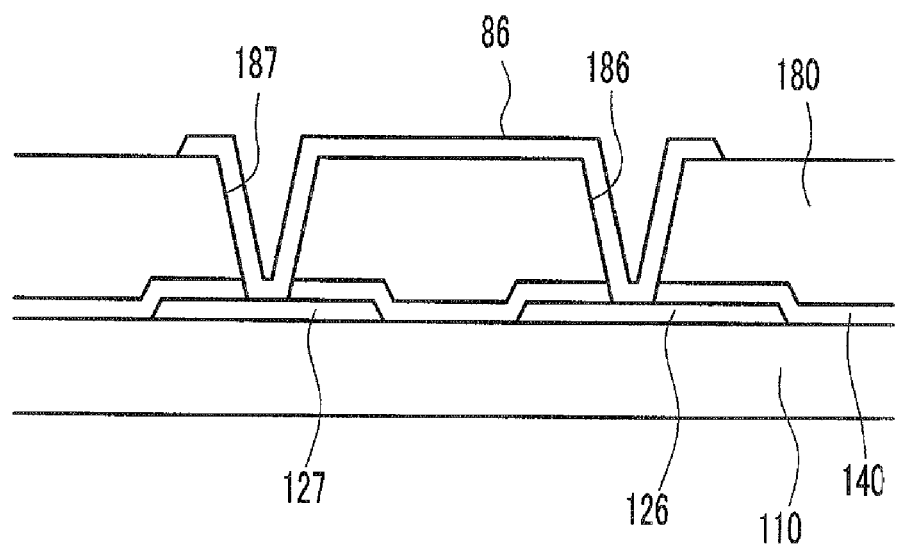
FIG. 8 is a cross-sectional view of the gate driver of FIG. 7 taken along line VIII-VIII.

FIG. 7 is a layout view of the relationship between the transistor T4 of the gate driver as shown in FIG. 6 and a scanning start signal line, and FIG. 8 is a cross-sectional view taken along line VIII-VIII of FIG. 7.

Referring to FIG. 6, the first stage ST1 of the shift register 400 is supplied with the scanning start signal STV instead of the previous carry signal. That is, the scanning start signal line for transmitting the scanning start signal STV is connected to the gate electrode of the transistor T4 of the first stage ST1. Hereinafter, the relationship between the scanning start signal and the transistor T4 of the first stage ST1 will be described in detail.

Referring to FIG. 7 and FIG. 8, a lead line 126 of the transistor T4 and a scanning start signal line 127 are formed on the substrate 110. The lead line 126 of the transistor T4 and the scanning start signal line 127 are made of the same material as the gate lines $G_i$ and $G_{i-1}$ formed on the display area of the substrate 110. They may be made of aluminum-based metals such as aluminum (Al) and aluminum alloys, silver-based metals such as silver (Ag) and silver alloys, copper-based metals such as copper (Cu) and copper alloys, molybdenum-based metals such as molybdenum (Mo) and molybdenum alloys, chrome (Cr), titanium (Ti), tantalum (Ta), and so on. The lead line 126 of the transistor T4 and the scanning start signal line 127, however, may have a multilayered structure including two conductive layers (not shown) having different physical properties.

Lateral sides of the lead line 126 of the transistor T4 and the scanning start signal line 127 are inclined with respect to the surface of the substrate 110, and the inclination angle is about 30 to 80°.

A gate insulating layer 140 made of silicon nitride (SiNx) or the like is formed over the lead line 126 of the transistor T4, the scanning signal line 127, and the substrate 110.

A passivation layer 180 is formed on the gate insulating layer 140. The passivation layer 180 is made of an inorganic insulator such as silicon nitride or silicon oxide, an organic insulator, a low dielectric constant insulator, or the like. The dielectric constant of the organic insulator and the low dielectric constant insulator is less than 4.0, and examples of the low dielectric constant insulator include a-Si:C:O, a-Si:O:F, and the like, formed by plasma enhanced chemical vapor deposition (PECVD). The passivation layer 180 may be made of an organic insulator having photosensitivity, and the surface of the passivation layer may be flat. Alternatively, the passivation layer 180 may have a multilayered structure of a lower inorganic layer and an upper organic layer.

The passivation layer 180 has a plurality of contact holes 186 and 187 respectively exposing the lead line 126 of the transistor T4 and the scanning start signal line 127.

A connecting member 86 is formed over the passivation layer 180. The connecting member 86 is made of a transparent conductive material such as ITO or IZO, or a reflective metal such as aluminum, silver, or alloys thereof.

The lead line 126 of the transistor T4 is physically and electrically connected with the scanning start signal line 127 through the contact holes 186 and 187 to receive the scanning start signal STV from the scanning start signal line 127.

Now, a portion of a manufacturing method of a gate driver according to an exemplary embodiment of the present invention will be described with reference to FIG. 9A, FIG. 9B, FIG. 10A, FIG. 10B, and the above-explained FIG. 7 and FIG. 8.

Figure 9A:
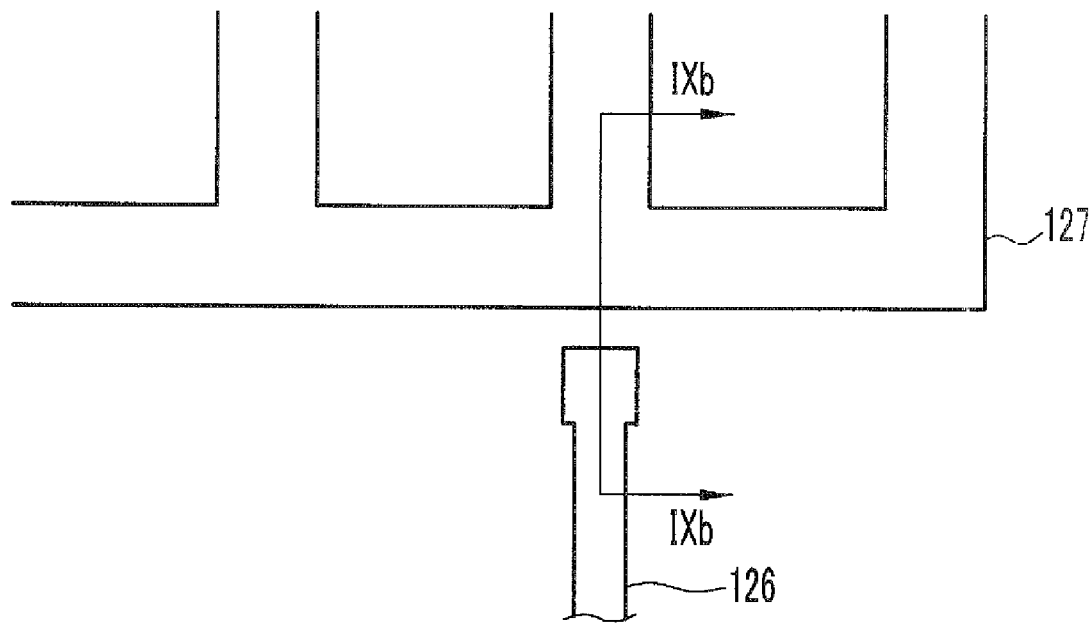
FIG. 9A and FIG. 10A are layout views of part of a manufacturing process of the gate driver as shown in FIGS. 7 and 8, and FIG. 9B and FIG. 10B are cross-sectional views taken along lines IXb-IXb and Xb-Xb of FIGS. 9A and 10A, respectively.
Figure 9B:
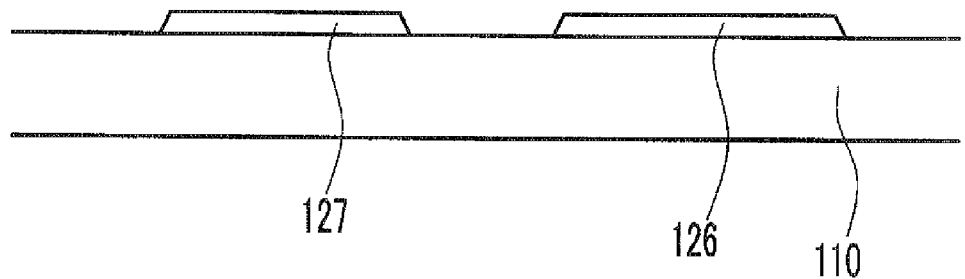
Figure 10A:
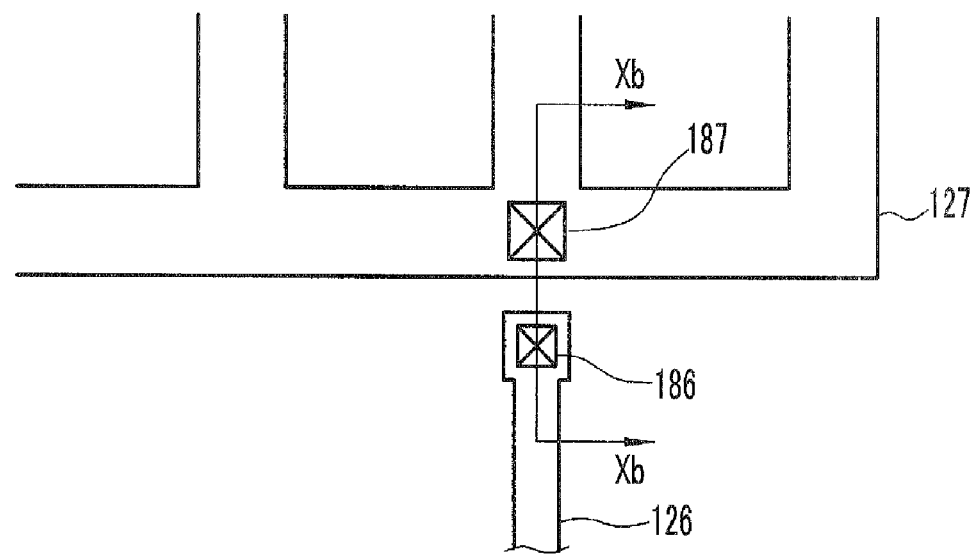
Figure 10B:
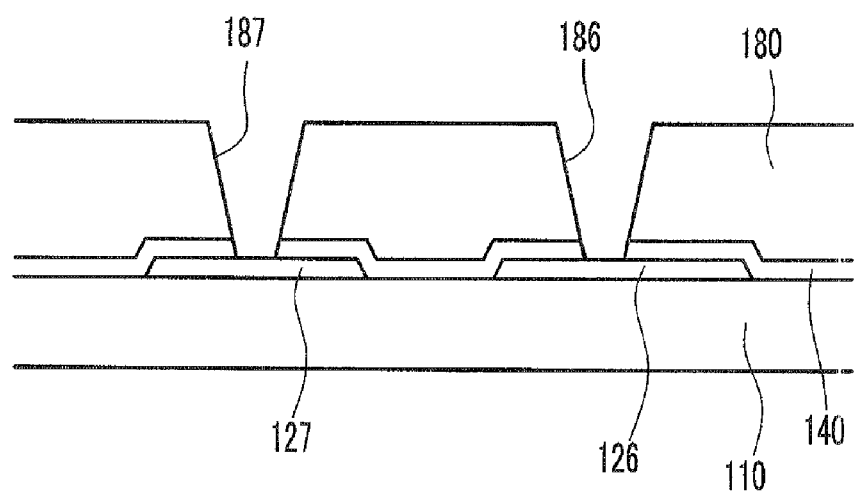

FIG. 9A and FIG. 10A are layout views of part of a manufacturing process of the gate driver according to an exemplary embodiment of the present invention, and FIG. 9B and FIG. 10B are cross-sectional views cut along lines IXb-IXb and Xb-Xb of FIGS. 9A and 10A, respectively.

Hereinafter, for convenience of explanation, the parts as shown in FIGS. 7 and 8 of the gate driver 400 according to an exemplary embodiment, of the present invention will be specifically described.

Referring to FIG. 9A and FIG. 9B, a metallic layer is formed on an insulating substrate 110 made of transparent glass or plastic, and is then etched to form a scanning start signal line 127, a plurality of transistors, (not shown) and a lead line 126 of the transistor T4.

Subsequently, as shown in FIG. 10A and FIG. 10B, a gate insulating layer 140 made of silicon nitride or the like is formed on the lead line 126 of the transistor T4 and the scanning start signal line 127 by plasma enhanced chemical vapor deposition (PECVD).

Thereafter, a passivation layer 180 is deposited on the gate insulating layer 140 by plasma enhanced chemical vapor deposition (PECVD). The passivation layer 180 and the gate insulating layer 140 are then etched to expose parts of the lead line 126 of the transistor T4 and of the scanning start signal line 127.

Subsequently, as shown in FIG. 7 and FIG. 8, an IZO or ITO layer is deposited on the passivation layer 180 by sputtering and patterned by a photolithography process using a photosensitive layer to form a connecting member 86 shown in FIG. 8.

During this process, static electricity is easily generated. More particularly, static electricity is easily generated during the process of stacking and etching the gate insulating layer 140 and the passivation layer 180 that is carried out after the formation of the lead line 126 of the transistor 140 and the scanning start signal line 127. When static electricity is generated, it easily enters the gate driver 400 through a test pad portion 60. The transistor T4 that is directly connected to the scanning start signal line 127 of the test pad portion 60 is easily damaged due to the generation of this static electricity. Accordingly, the lead line 126 of the transistor T4 and the scanning start signal line 127 are not directly connected but are formed separately from each other in this exemplary embodiment of the present invention. The lead line 126 of the transistor t4 and the scanning start signal line 127 are connected via the connecting member 86 after the process of forming the gate insulating layer 140 and the passivation layer 180 where static electricity is mostly generated, thereby preventing damage to the transistor T4 caused by static electricity.

Now, a gate driver according to an exemplary embodiment of the present invention will be described in detail with reference to FIG. 11.

Figure 11:
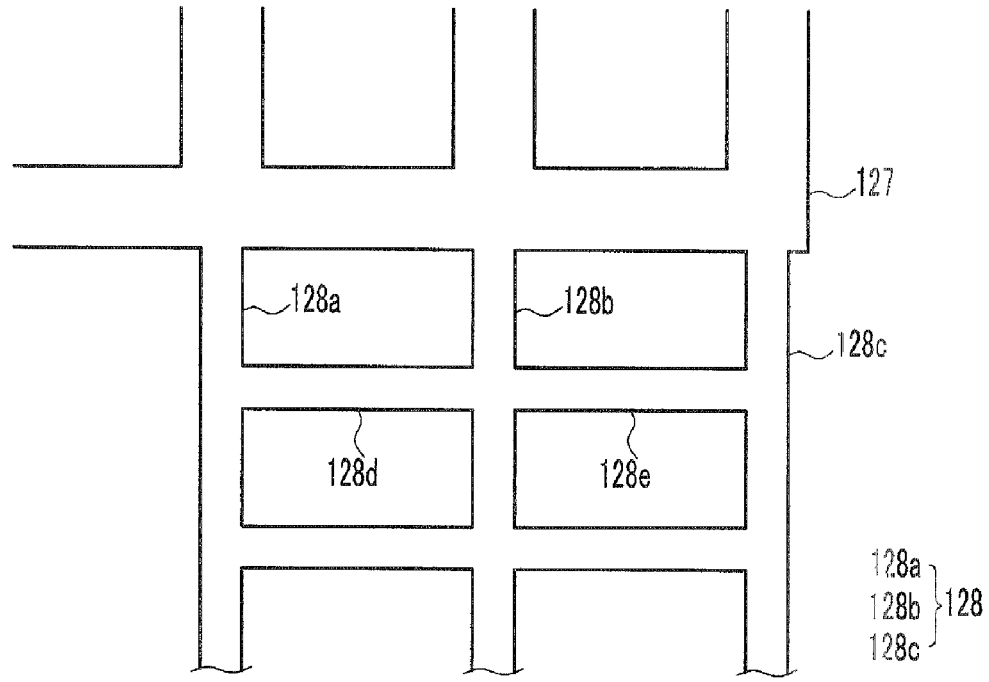
FIG. 11 is a layout view of part of a gate driver according to an exemplary embodiment of the present invention.

FIG. 11 is a layout view of part of a gate driver according to an exemplary embodiment of the present invention.

Referring to FIG. 11, a lead line 128 of a transistor T4 and a scanning start signal line 127 are formed on a substrate (not shown). A gate insulating layer (not shown) is formed on the lead line 128 of the transistor T4, the scanning start signal line 127, and the substrate. A passivation layer (not shown) is formed on the gate insulating layer.

The gate driver of FIG. 11 is directly connected to the scanning start signal line 127 and the lead line 128 of the transistor T4, unlike the gate driver shown in FIGS. 7 and 8. The lead line 128 of the transistor T4 includes a plurality of branches 128a, 128b, and 128c, and the branches 128a, 128b, and 128c are connected to each other via a plurality of connecting lines 128d and 128e. When static electricity is generated and flows into the transistor T4 through the scanning start signal line 127, the static electricity is dispersed via the plurality of branches 128a, 128b, and 128c and flows thereinto. Accordingly, even if the scanning start signal line 127 and the lead line 128 of the transistor T4 are directly connected, the damage to the transistor T4 caused by the generation of static electricity is reduced.

Now, a gate driver according to an exemplary embodiment of the present invention will be described in detail with reference to FIG. 12.

Figure 12:
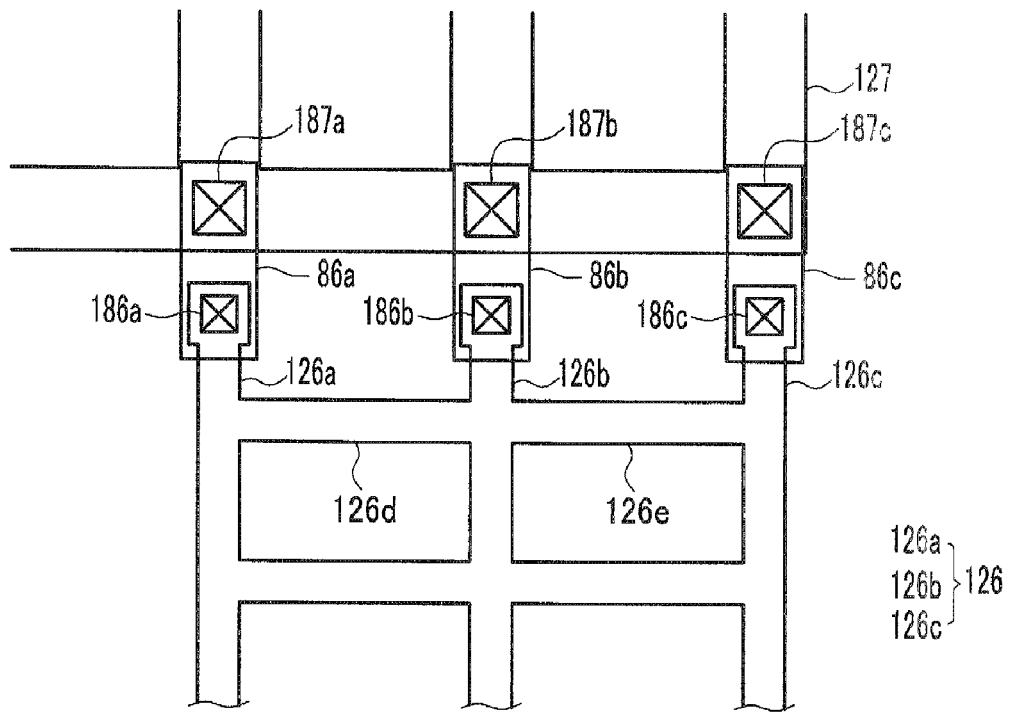
FIG. 12 is a layout view of part of a gate driver according to an exemplary embodiment of the present invention.

FIG. 12 is a layout view of a gate driver according to an exemplary embodiment of the present invention.

Referring to FIG. 12, a lead line 126 of a transistor T4 and a scanning start signal line 127 are formed on a substrate (not shown). A gate insulating layer (not shown) is formed on the lead line 128 of the transistor T4, the scanning start signal line 127, and the substrate. A passivation layer (not shown) is formed on the gate insulating layer.

Like the gate driver shown in FIG. 11, in the gate driver shown in FIG. 12, the lead line 126 of the transistor T4 also includes a plurality of branches 126a, 126b, and 126c. Unlike the gate driver of FIG. 11, however, the plurality of branches 126a, 126b, and 126c are not directly connected to the scanning start signal. Like the gate driver shown in FIGS. 7 and 8, in the gate driver shown in FIG. 12, each of the branches 126a, 126b, and 126c and the scanning start signal 127 are connected to each other via a plurality of contact holes 186a, 186b, and 186c and a plurality of connecting members 86a, 86b, and 86c. Each of the branches 126a, 126b, and 126c are connected with a plurality of connecting lines 126d and 126e. Accordingly, static electricity is prevented from flowing into the transistor T4, and even if static electricity flows thereinto, the static electricity is dispersed, thereby minimizing the damage thereof.

According to exemplary embodiments of the present invention, static electricity is prevented from flowing into the gate driver integrated on a display panel during a manufacturing process of a liquid crystal display, thereby minimizing damage to the gate driver.

While the invention has been described in terms of exemplary embodiments, it will be clear that this invention is not limited to these exemplary embodiments and that many changes and modifications will be obvious to those skilled in the art without departing from the true spirit and scope of the invention.

What is claimed is:

1. A liquid crystal display, comprising:
    a substrate, a plurality of pixels including a plurality of switching elements formed on the substrate;
    a plurality of gate lines connected to the switching elements and extending in a row direction; and
    a gate driver including a circuit portion connected to the gate lines and a wiring portion connected to the circuit portion,
    wherein the circuit portion includes a plurality of stages connected to the gate lines, and a transistor including a lead extending from a gate electrode of the transistor, and the wiring portion includes a first signal line that receives an externally supplied signal and transmits the signal to the transistor, and the lead of the transistor and the first signal line are connected via a connecting member, and the connecting member on the substrate is formed on a different layer from the lead of the transistor and the signal line, and the first signal line transmits a scanning start signal to the transistor, and wherein the lead of the transistor and the signal line are disposed on a same layer.

2. The liquid crystal display of claim 1, wherein the transistor comprises a control terminal, the control terminal and the first signal line are made of the same material as the plurality of gate lines.

3. The liquid crystal display of claim 2, further comprising at least one lead line connected to the control terminal and connected to the first signal line via the connecting member.

4. The liquid crystal display of claim 1, wherein the connecting member is comprised of ITO (indium tin oxide) or IZO (indium zinc oxide).

5. The liquid crystal display of claim 4, wherein the liquid crystal display further comprises a passivation layer formed between the connecting member and the first signal line and between the connecting member and the transistor.

6. The liquid crystal display of claim 5, wherein the passivation layer has a first contact hole for connecting the first signal line and the connecting member and a second contact hole for connecting the transistor and the connecting member.

7. The liquid crystal display of claim 1, wherein the circuit portion and the wiring portion are integrated on the substrate, respectively.

8. The liquid crystal display of claim 1, the wiring portion further comprises a second signal line that transmits control signals to the circuit portion.

9. A liquid crystal display, comprising;
a substrate;
a plurality of pixels including a plurality of switching elements formed on the substrate;
a plurality of gate lines connected to the switching elements and extending in a row direction; and
a gate driver including a plurality of circuit portions connected to the gate lines and a wiring portion connected to the circuit portions,
wherein the wiring portion includes a signal line and each of the circuit portions includes a transistor connected to the signal line, and the transistor includes a lead line which comprises at least two branches connected to the signal line, and the signal line transmits a scanning start signal to the transistor.

10. The liquid crystal display of claim 9, wherein the lead line and the signal line are made of the same material as the gate lines.

11. The liquid crystal display of claim 9, wherein the at least two branches are directly connected to the signal line.

12. The liquid crystal display of claim 9, wherein the at least two branches are connected to the signal line via a connecting member.

* * * * *